United States Patent
Atkinson et al.

(10) Patent No.: US 9,866,215 B2
(45) Date of Patent: Jan. 9, 2018

(54) HIGH SPEED LOW CURRENT VOLTAGE COMPARATOR

(71) Applicant: Silicon Laboratories Inc., Austin, TX (US)

(72) Inventors: Nicholas Montgomery Atkinson, Austin, TX (US); Praveen Kallam, Austin, TX (US); Mohamed Mostafa Elsayed, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 21 days.

(21) Appl. No.: 14/870,185

(22) Filed: Sep. 30, 2015

(65) Prior Publication Data
US 2017/0093399 A1    Mar. 30, 2017

(51) Int. Cl.
*H03K 5/06* (2006.01)
*H03K 19/00* (2006.01)
*H03K 5/24* (2006.01)

(52) U.S. Cl.
CPC .......... *H03K 19/0016* (2013.01); *H03K 5/06* (2013.01); *H03K 5/2481* (2013.01)

(58) Field of Classification Search
CPC .. H03K 19/0016; H03K 5/06; H03K 5/24811; H03K 5/2481
See application file for complete search history.

(56) References Cited

U.S. PATENT DOCUMENTS

| | | | | |
|---|---|---|---|---|
| 5,268,872 A | * | 12/1993 | Fujii | G11C 8/18 327/415 |
| 5,278,467 A | * | 1/1994 | Nedwek | H03K 5/2481 327/52 |
| 5,491,455 A | * | 2/1996 | Kuo | H03F 1/3211 330/253 |
| 6,433,521 B1 | * | 8/2002 | Chen | G11C 5/147 323/224 |
| 6,791,371 B1 | * | 9/2004 | Cheung | H03K 5/19 327/63 |
| 7,525,379 B2 | * | 4/2009 | Mukherjee | H03F 3/45183 330/253 |
| 7,558,125 B2 | * | 7/2009 | Blodgett | G11C 7/02 365/189.05 |

OTHER PUBLICATIONS

Silicon Labs, "EFM . . . the work's most energy friendly microcontrollers. EFM32ZG108 Datasheet," EFM32ZG108FXX-d0063_Rev1.10, Mar. 6, 2015, 54 pages.
U.S. Appl. No. 14/841,915, filed Sep. 1, 2015, entitled "Providing Multiple Power Paths in an Integrated Circuit," by Matthew R. Powell.

* cited by examiner

*Primary Examiner* — Jung Kim
(74) *Attorney, Agent, or Firm* — Trop, Pruner & Hu, P.C.

(57) ABSTRACT

In one embodiment, a voltage comparator circuit includes a first comparator circuit to compare a first voltage and a second voltage and a second comparator circuit to compare the first voltage and the second voltage. The voltage comparator circuit may include charge storage circuitry and positive feedback circuitry. Such circuitry may boost current within the first and second comparator circuits to enable the voltage comparator circuit to output a comparison decision within a delay threshold in response to input transitions within a slew rate threshold.

18 Claims, 9 Drawing Sheets

HIGH SPEED LOW CURRENT VOLTAGE COMPARATOR

BACKGROUND

Comparator circuits are useful to compare multiple inputs such as in the form of multiple voltages. While many different topologies of comparator circuits are available, certain architectures suffer from common drawbacks, including delays inherent in the circuitry, which delays the time until a valid comparison decision can be made. Some systems require a high slew rate for changing values and resulting comparison results. To accommodate such requirements, typically circuitry that consumes high amounts of current is used. Yet many systems seek to reduce the amount of power consumption and as such, there are tradeoffs that can lead to less than optimal performance.

SUMMARY OF THE INVENTION

In one aspect, an apparatus comprises: a first comparator and a second comparator. The first comparator may have a first common gate input stage with a first input terminal to receive a first voltage and a second input terminal to receive a second voltage, a first capacitor coupled between the first input terminal and a common gate connection of the first common gate input stage, the first common gate input stage to output a first comparison signal, and a first feedback circuit to provide a first boost current to the first common gate input stage responsive to a first value of the first comparison signal and to pull down a level of the first comparison signal responsive to a first value of a second comparison output signal, the first comparator to output a first comparison output signal based on the first comparison signal. In turn, the second comparator may have a second common gate input stage with a first input terminal to receive the second voltage and a second input terminal to receive the first voltage, and a second capacitor coupled between the first input terminal of the second common gate input stage and a common gate connection of the second common gate input stage, the second common gate input stage to output a second comparison signal, the second comparator to output the second comparison output signal based on the second comparison signal.

In an embodiment, the apparatus may further include a second feedback circuit to provide a second boost current to the second common gate input stage responsive to a first value of the second comparison signal and to pull down a level of the second comparison signal responsive to a first value of the first comparison output signal The first comparator may further comprise: a first inverter to receive the first comparison signal and to invert the first comparison signal, the first inverter to be powered by the first voltage; and a second inverter to receive the inverted first comparison signal and to output the first comparison output signal, the second inverter to be powered by the second voltage. And, the first comparator may further comprise: a first delay circuit to receive the first comparison output signal and to output a first control signal to enable the first feedback circuit to provide the first boost current. In an example, the first delay circuit comprises: a first metal oxide semiconductor field effect transistor (MOSFET) having a gate terminal to receive the first comparison output signal and a second terminal coupled to a resistor-capacitor (RC) network; and a second MOSFET having a gate terminal to receive the first comparison output signal and a second terminal coupled to the resistor of the RC network, the RC network to provide the first control signal to the first feedback circuit. The first comparator may generate the first comparison output signal within 100 nanoseconds of a change in at least one of the first voltage and the second voltage.

In an example, the first feedback circuit includes a first branch, the first branch to be disabled based on a state of the second comparison output signal, wherein disabling the first branch is to reduce power consumption of the apparatus. This first branch may comprise: a first MOSFET having a gate terminal to receive the second comparison output signal, a first terminal coupled to a first current source and a second MOSFET, and a second terminal coupled to an output of the first common gate input stage. The first feedback circuit may further include a second branch comprising a third MOSFET having a gate terminal to receive the first comparison signal, a first terminal coupled to a fourth MOSFET, and a second terminal coupled to the first common gate input stage, where the fourth MOSFET is to be gated by a first control signal received from a first delay circuit.

In an example, the apparatus further includes: a logic circuit to monitor for a transition in at least the first comparison output signal and to generate an output signal based thereon; and a rectifier circuit to provide the maximum one of the first voltage and the second voltage to the logic circuit. An integrated circuit (IC) may include the apparatus and further may include a voltage regulator to receive and regulate a selected one of the first voltage and the second voltage, based on the output signal.

In another aspect, a voltage comparator circuit includes a first comparator circuit to compare a first voltage and a second voltage and a second comparator circuit to compare the first voltage and the second voltage, the voltage comparator circuit including charge storage circuitry and positive feedback circuitry. Such circuitry may boost current within the first and second comparator circuits to enable the voltage comparator circuit to output a comparison decision within a delay threshold in response to input transitions within a slew rate threshold. In some cases, the voltage comparator circuit may operate with a static current level less than a static current threshold, the delay threshold less than 100 nanoseconds, the slew rate threshold less than 5 volts per microsecond, the static current threshold less than one micro-ampere.

In an example, the first comparator circuit comprises: a first common gate input stage to receive the first voltage and the second voltage and to generate a first comparison value based on the comparison of the first voltage and the second voltage; and a first feedback circuit to control a level of the first comparison value, where the first comparator circuit is to output a first comparison output signal based on the first comparison value. In turn, the second comparator circuit comprises: a second common gate input stage to receive the first voltage and the second voltage and to generate a second comparison value based on the comparison of the first voltage and the second voltage; and a second feedback circuit to control a level of the second comparison value, where the second comparator circuit is to output a second comparison output signal based on the second comparison value, the first comparison output signal and the second comparison output signal comprising the comparison decision.

In an example, the first common gate input stage comprises: a MOSFET having a first terminal to couple to the first voltage, a second terminal to couple to a first current source, and a gate terminal coupled to a gate terminal of a second MOSFET, the second terminal of the first MOSFET to further couple to the gate terminal of the first MOSFET; and the second MOSFET having a first terminal to couple to the second voltage and a second terminal to output the first comparison value.

In an example, the first feedback circuit comprises a third MOSFET having a first terminal to couple to a second current source, a second terminal coupled to the second terminal of the second MOSFET, and a gate terminal to receive the second comparison output signal. A first capacitor may be coupled to the gate terminal and the first terminal of the first MOSFET. A logic circuit may be coupled to receive the first comparison output signal and the second comparison output signal and to output an output signal based thereon.

In another example, a comparator circuit includes: a common gate input stage including a first switching device to receive a first voltage, a second switching device to receive a second voltage, the first and second switching devices being coupled together, and third and fourth switching devices controllable to form a current mirror configuration of the common gate input stage in which a selectable one of the first switching device and the second switching device is to be configured as a diode, the common gate input stage to output a first comparison signal and a second comparison signal; a feedback circuit to controllably provide a boost current to one of the first switching device and the second switching device, and to provide a pull down current to the other of the first switching device and the second switching device; and a delay circuit to generate at least one control signal to be provided to the feedback circuit to control the boost current provision by the feedback circuit.

The third and fourth switching devices may further couple a capacitor to the selectable one of the first switching device and the second switching device. In an example, the feedback circuit comprises a positive feedback circuit to provide the boost current to cause the common gate input stage to cause a state change in at least one of the first comparison signal and the second comparison signal responsive to a level cross between the first voltage and the second voltage, faster than a slew rate threshold.

DETAILED DESCRIPTION

In various embodiments, a comparison circuit architecture is provided that enables comparison decisions to be made at high speed, while operating with relatively low current consumption levels. Different architectures are presented herein, including a so-called dual comparator architecture and a single comparator architecture. These architectures and variations on such architectures may be used in a wide variety of situations to enable rapid comparison decisions to be made with reduced power consumption.

Figure 1:
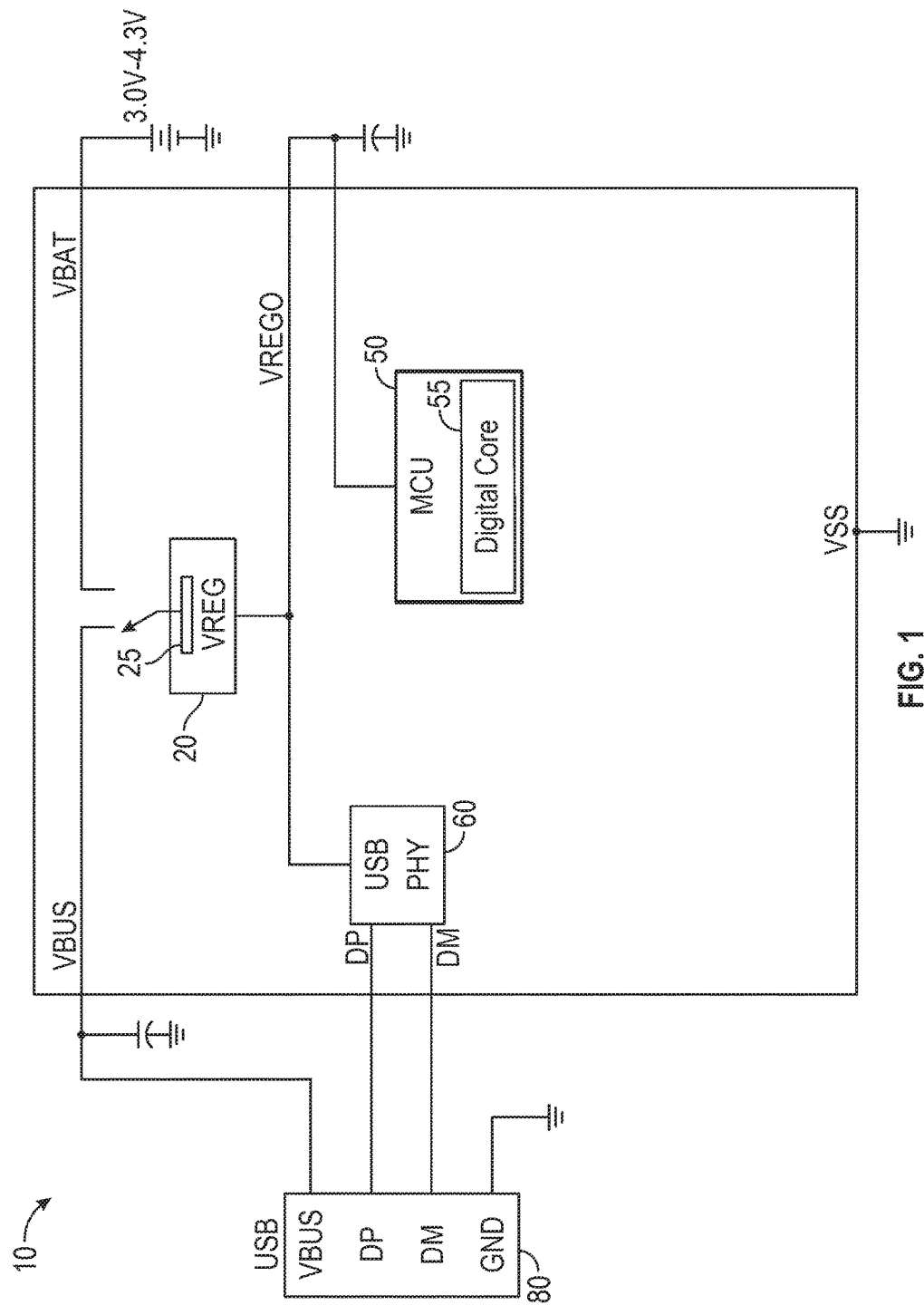
FIG. 1 is a block diagram of an apparatus in accordance with an embodiment.

Referring now to FIG. 1, shown is a block diagram of an apparatus in accordance with an embodiment. As seen in FIG. 1, apparatus 10 may be a given integrated circuit (IC) such as including a microcontroller unit (MCU) and/or other circuitry including various components that operate on power via a given operating voltage. In the embodiment shown, apparatus 10 is configured to receive multiple sources of power. In the example shown, these sources of power can include a battery source Vbat and a bus voltage Vbus provided by another device 80, such as a given universal serial bus (USB) device 80. As seen, the voltages provided by these sources are provided to a voltage regulator 20 of apparatus 10. To determine which voltage to use to perform voltage regulation, regulator 20 includes a comparator circuit 25. As will be described herein, comparator circuit 25 may perform comparisons between these two incoming voltages at high speed and very low current consumption levels, such that rapid determinations and resulting switching operations can occur. Understand that while shown as implemented within regulator 20, a comparator circuit may be located elsewhere within apparatus 10. Still further, understand that comparator circuit 25 may be used more generally for a variety of different voltage comparisons, and need not be limited to supply voltage comparisons. However, for ease of discussion of a representative use case, the following Figures will discuss use of a comparator circuit in connection with two voltages (v1 and v2) which may, in one example, be those supply voltages.

With further reference to FIG. 1, regulator 20 outputs a regulated voltage Vrego to various components, including a USB physical (PHY) unit 60 which is configured to communicate via a data channel with USB device 80. Still further, the regulated output Vrego is also provided to a MCU 50 having a digital core 55. Understand while shown at this high level in the embodiment of FIG. 1, various other components may be present within apparatus 10 and further that various voltages generated can be provided to other consumers, both on and off-chip.

Figure 2:
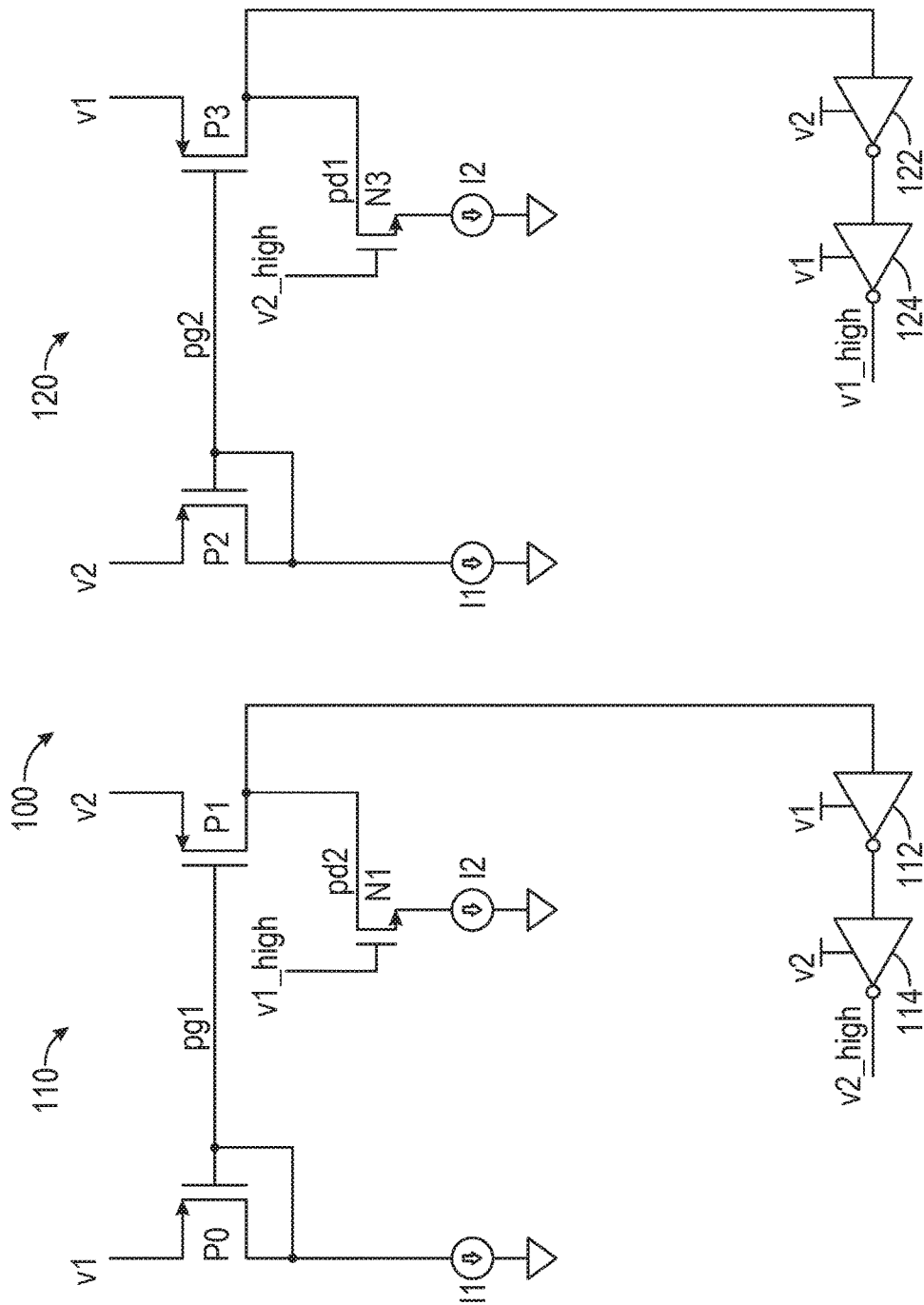
FIG. 2 is a schematic diagram of a comparator circuit in accordance with an embodiment.

Referring now to FIG. 2, shown is a schematic diagram of a comparator circuit in accordance with an embodiment. As one example, comparator circuit 100 may be implemented as circuit 25 within voltage regulator 20 of FIG. 1. As seen, comparator circuit 100 is configured as a voltage comparator to compare two incoming voltages via a dual comparator architecture. As seen, this architecture includes two independent comparator circuits 110 and 120. For ease of discussion, the components of comparator circuit 120 will be discussed, with the understanding that a similar arrangement is present in comparator circuit 110. In fact, note that the only difference in the two circuits is that the input voltages are provided to opposite input transistors of the comparator circuits (and of course comparator circuit 110 has different enumerations of components and signals).

Now with reference to comparator circuit 120, a common gate input stage is provided with two input transistors, namely P-channel metal oxide semiconductor field effect transistors (MOSFET generally and PMOS specifically) P2 and P3 having source terminals configured to receive the incoming voltages to be compared. As seen, MOSFET P3 receives a first voltage v1 and PMOS P2 receives a second voltage v2. In a representative particular example, v1 is a battery voltage and v2 is a bus voltage, e.g., received from a USB device. Understand that different voltages may be provided in other embodiments to enable comparisons between two voltages, such as voltages that represent sensor values or so forth. As further illustrated, transistors P2 and P3 have commonly coupled gate terminals (at signal level pg2). PMOS P2 has a drain terminal coupled to a first current source $I_1$. The gate and drain terminals of PMOS P2 are coupled together in a diode connection and to the gate terminal of PMOS P3 to provide a current mirror configuration.

With reference to PMOS P3, its drain terminal is in turn coupled to a feedback circuit formed of a N-channel MOSFET (NMOS) N3 having a source terminal coupled to a second current source (I2). And in turn, NMOS N3 is gated by a gate signal v2_high, which is the comparison output signal of comparator circuit 110.

The output of PMOS P3, pd1, is thus a comparison signal representing the output of the comparison between the two input voltages, and is provided to a pair of inverters 122 and 124, each of which is driven by one of the corresponding input voltages, to output a comparison output signal, v1_high.

In operation, PMOS P3 provides a high output for pd1 via the drain terminal of PMOS P3 when v1 is greater than v2. In turn, PMOS P1 of comparator circuit 110 provides a high output for pd2 when v2 is greater than v1. Feedback circuit N3 (and corresponding feedback circuit N1 of comparator circuit 110) provides hysteresis. When v2 is greater than v1 (and thus v1_high is low), NMOS N3 is on (v2_high is high), and pd1 is pulled low, and thus the current in PMOS P3 is to exceed current source I2. Thus, hysteresis is realized when I2 is greater than I1, and the amount of hysteresis is the ΔVsg of PMOS P3 corresponding to the current difference of I2−I1. Similarly, in this state NMOS N1 is off (v1_high is low) and PMOS P1 pulls the pd2 signal up quickly without any DC pull down current.

Note further that by provision of the feedback NMOSs N1 and N3, power savings can be realized when the corresponding device is switched off. For example, with reference to comparator circuit 120, when v2_high is low, NMOS N3 is off and thus the current consumption of current source I2 is saved.

Figure 3A:
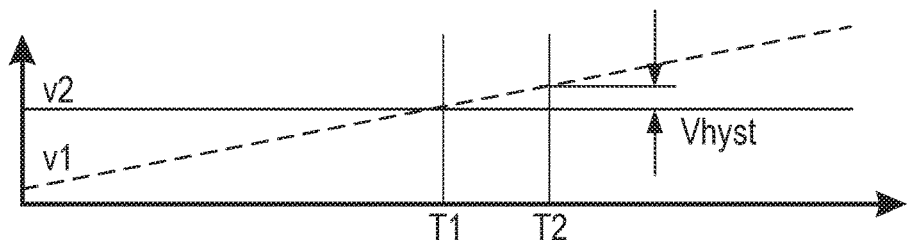
FIGS. 3A-3D are graphical illustrations of signal levels at various points within a comparator circuit in accordance with an embodiment.

Referring now to FIGS. 3A-3D, shown are graphical illustrations of signal levels at various points within comparator circuits 110 and 120. In the illustration of FIG. 3A, assume that v2 is a steady voltage, and that v1 is an increasing voltage, such that a transition occurs at time T1 in which the level of v1 exceeds the level of v2. At time T2 the voltage v2 exceeds that of v1 by amount Vhyst, which is the amount of hysteresis in the comparator.

Figure 3B:
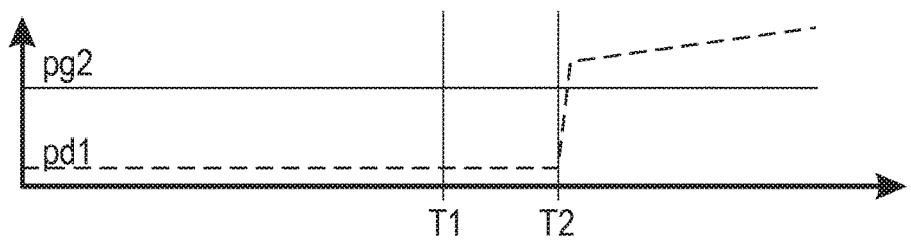

FIG. 3B shows the effect of these voltages in comparison circuit 120. Specifically shown are the values of the pg2 and pd1 signals. Signal pg2 remains at a constant voltage level (namely a $V_{SG}$ below v2). Instead, pd1 is initially low when v2 is higher than v1. Then after the transition of v1 to exceed v2 by amount Vhyst (at time T2), pd1 rises. Note that PMOS P3 is not current-limited, so the rise time of pd1 is solely dependent on the Vsg of PMOS P3, which is dependent on the difference between v2 and v1.

Figure 3C:
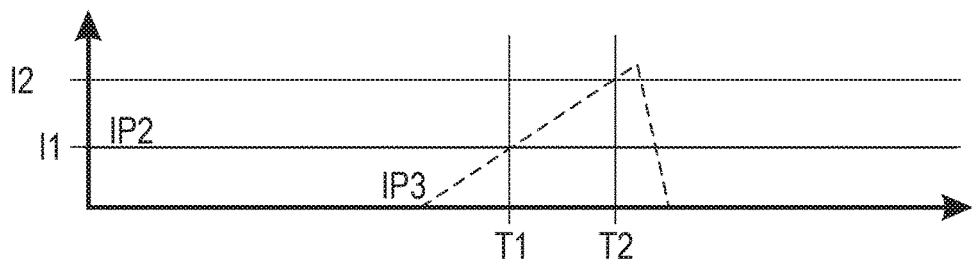
Figure 3D:
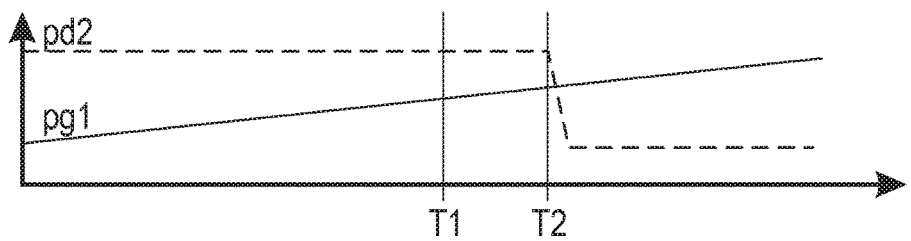

FIG. 3C shows the currents in PMOSs P2 and P3 of comparison circuit 120. As v1 increases and exceeds v2 at time T2, the current in PMOS P3 (IP3) rises until it exceeds I2 enough to pull pd1 high. The current in PMOS P2 (IP2) remains constant, and IP3 falls to zero after the comparator decision is complete since v1_high is pulled low, disabling the DC current I2. And FIG. 3D shows signals present in comparison circuit 110, namely pd2 and pg1. The voltage of pg1 increases at the same rate as v1, maintaining a constant Vsg across PMOS P0. As shown, initially pd2 is high, as v2 is greater than v1. After the transition in voltages at T2, this signal level falls because when v1_high is pulled up the pulldown current I2 is enabled and pulls down pd2. Note that the falling edge of pd2 is limited by the current I2, so it is significantly slower than the rising edge of pd1, which is not current-limited.

Figure 4:
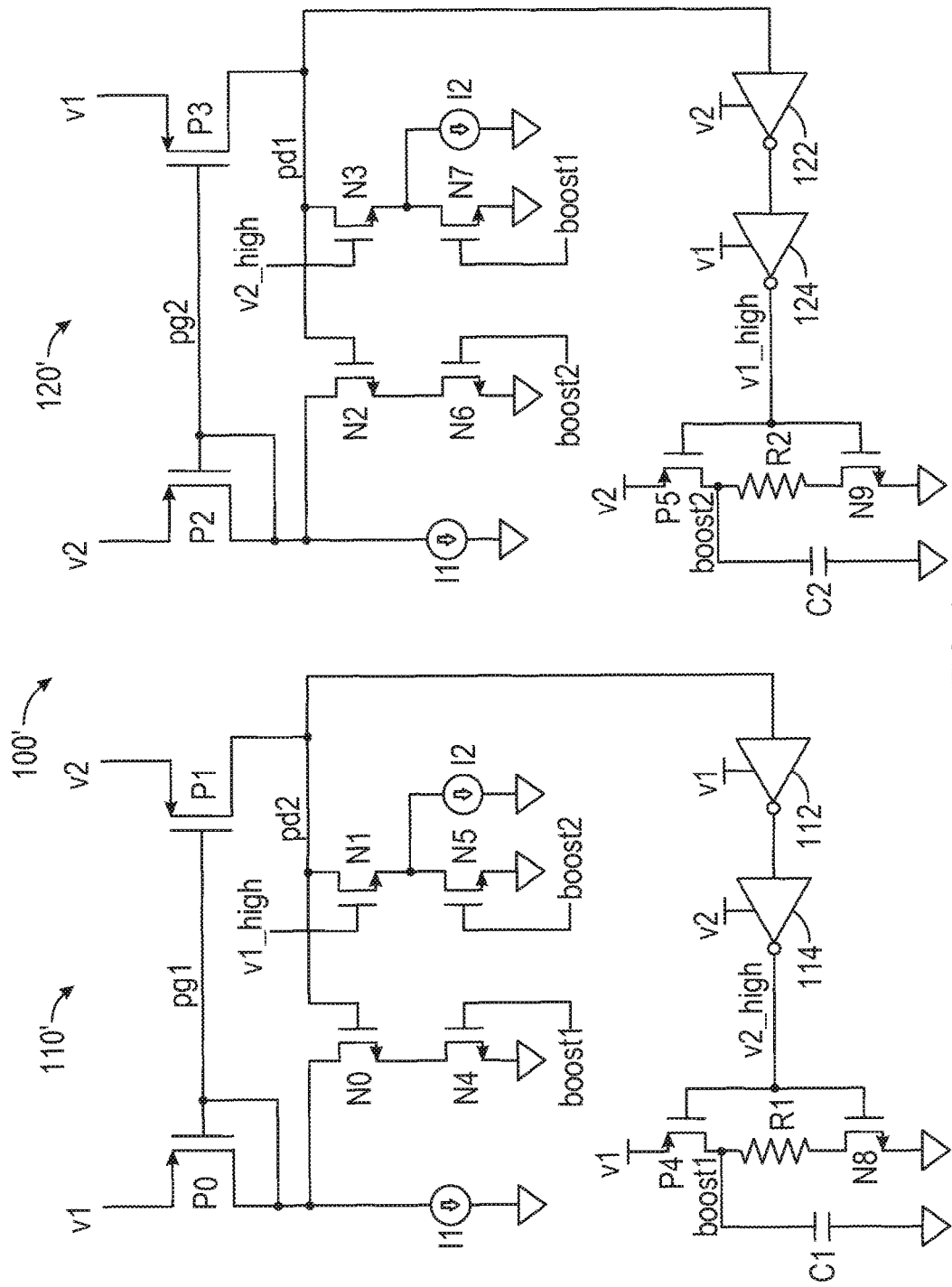
FIG. 4 is a schematic diagram of another comparator circuit in accordance with an embodiment.

Referring now to FIG. 4, shown is a schematic diagram of another comparator circuit in accordance with an embodiment. In the arrangement in FIG. 4, much of the circuitry is the same as comparator 100 of FIG. 2. However note that dual comparator circuit 100' includes additional components not present in FIG. 2. As above, the details of comparator circuit 120' are discussed, with the understanding that similar components and operation adhere in comparator circuit 110'. Specifically, with reference to comparator circuit 120', additional NMOS devices N2, N6 and N7 are provided to form a more integrated positive feedback circuit. As seen, NMOS N2 has a drain terminal coupled to the drain terminal of PMOS P2, a gate terminal coupled to the drain terminal of NMOS N3, and a source terminal coupled to a drain terminal of NMOS N6, in turn having a gate terminal to receive a gate voltage boost2 from a delay circuit (described further below) and a source terminal coupled to a reference voltage level (e.g., ground). In turn, an additional NMOS N7 has a drain terminal coupled to the source terminal of NMOS N3, a gate terminal coupled to receive a gate voltage boost1 from another delay circuit, and a source terminal coupled to the reference voltage level.

As further shown in FIG. 4, a delay circuit is formed of PMOS P5 and NMOS N9 having commonly coupled gate terminals to receive the comparison output signal of comparison circuit 120' (namely v1_high). The delay circuit acts as an RC delay circuit to enable a boost current to be provided to the common gate input stage, with a delay according to the characteristics of the RC elements R2 and C2. As seen, resistor R2 couples between the drain terminals of PMOS P5 and NMOS N9, and C2 couples to the drain terminal of PMOS P5, which provides a control signal boost2, which drives the gate terminals of NMOSs N6 and N5 (in 110').

Note with reference to comparator circuit 120', pd1 rises responsive to v1 exceeding v2, which turns on NMOS N2 of the positive feedback circuit. In turn, NMOS N2 provides the boost current through PMOSs P2 and P3, which in turn pulls the level of pd1 up quickly. In turn, this causes v1_high to transition to a high state, which turns on NMOS N1 (in comparator circuit 110'), which pulls pd2 down quickly. Note that the boosted pull up and pull down currents are sustained while boost2 discharges to the ground according to the RC delay of R2 and C2.

Figure 5A:
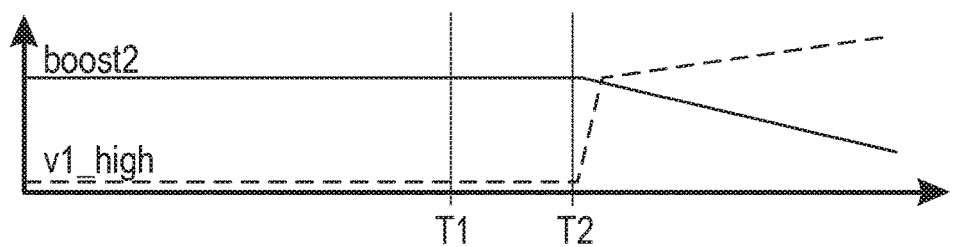
FIGS. 5A and 5B are graphical illustrations of signal levels during operation of a comparator circuit in accordance with an embodiment.
Figure 5B:
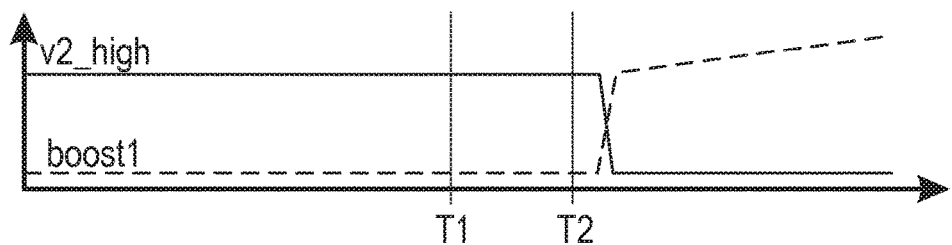

This is illustrated in FIGS. 5A and 5B, which are graphical illustrations of signal levels during operation of a comparator circuit 100'. As shown in FIG. 5A, boost2 is initially high (and v1_high is initially low). After the voltage supplies transition such that v1 is greater than v2, v1_high goes high, in turn disabling PMOS P5 of the delay circuit and enabling NMOS N9 of the delay circuit, such that boost2 decays according to RC delay of resistor R2 and capacitor C2. Note the rise time of v1_high is now determined by the boost current provided by NMOS N6, so it is significantly faster than the rise time in comparator circuit 100.

As shown in FIG. 5B, the opposite situation adheres in the delay circuit of comparator circuit 110'. Namely, boost1 is initially low (as v2_high is high), such that PMOS P4 is disabled and NMOS N8 is enabled. In reaction to v1_high rising and turning on NMOS N1 and enabling a boost pulldown current through NMOS N5, v2_high is quickly pulled low, in turn causing boost1 to quickly rise (as PMOS P4 is enabled and NMOS N8 is disabled). Note that the fall time of v1_high in this implementation is not limited by the bias current I2, but it is greatly accelerated by the boost current provided by NMOS N5. Furthermore, because the boost currents are only active when the input voltages cross one another, they may be much higher than currents I1 and I2 and not contribute to the DC power consumption of the comparator circuit. The DC power consumption of comparator circuit 100' is no different from that of comparator circuit 100, while the output response time is significantly less. Note that the other signals in comparator circuit 100' may act similarly as in FIGS. 3A-3D.

Figure 6:
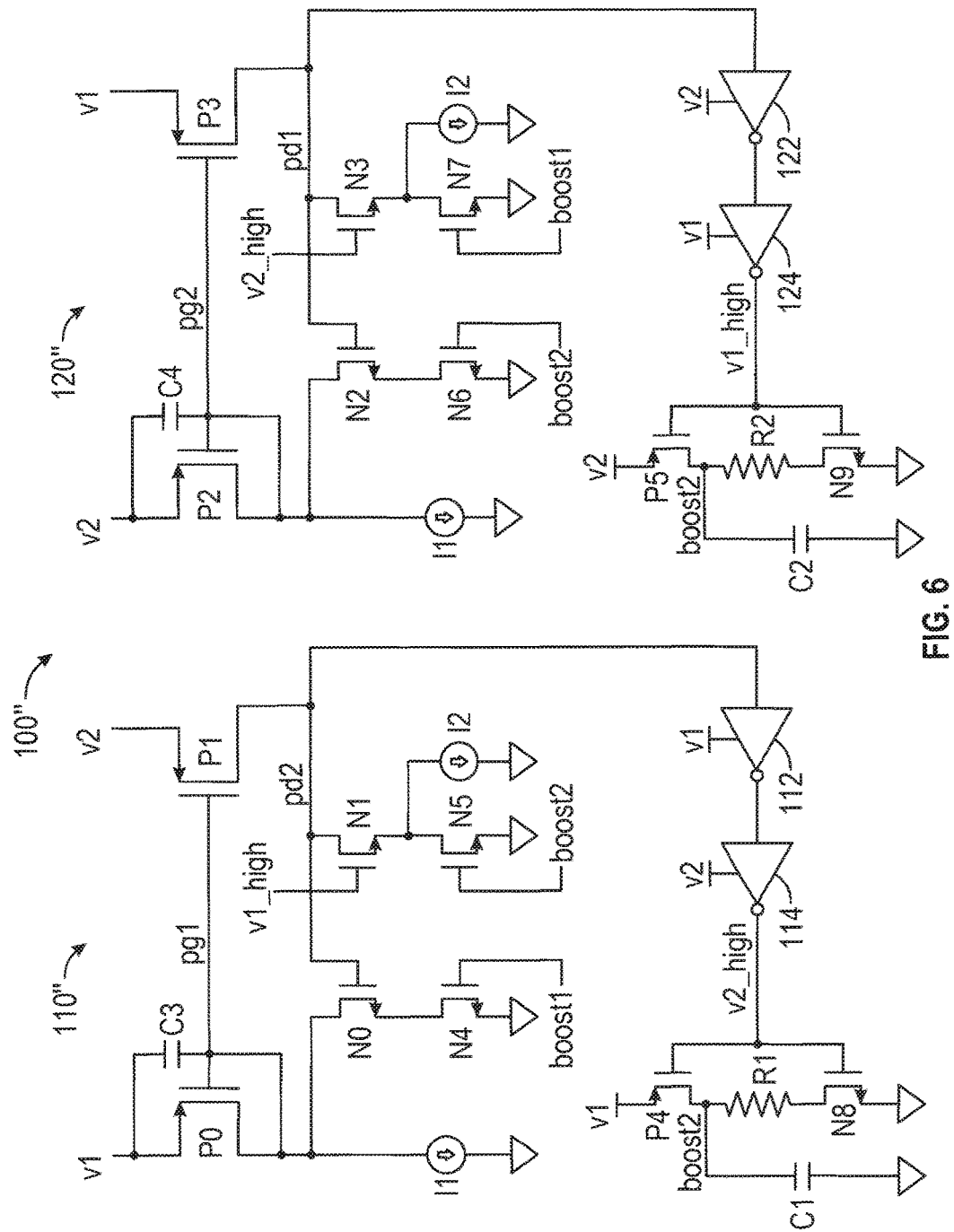
FIG. 6 is a schematic diagram of a comparator circuit in accordance with another embodiment of the present invention.

To provide greater isolation between the incoming voltages and faster comparison decisions, embodiments may provide capacitance to the input stages. Referring now to FIG. 6, shown is a schematic diagram of a comparator circuit in accordance with another embodiment. As shown in FIG. 6, comparator circuit 100" is generally configured the same as comparator circuit 100', with the addition of capacitors C3 and C4, coupled between the source and gate terminals of PMOSs P0 and P2, respectively. As an input voltage (such as v1) ramps up or down, capacitors C3/C4 stabilize the corresponding pg1/pg2 such that PMOSs P1 and P3 engage quickly as the voltage levels cross. More specifically, these capacitors hold and maintain constant $V_{SG}$ across P0 and P2 when either input is rising or falling. For example if v2 is constant while v1 rises, C3 will cause pg1 to rise at the same rate as v1, and C4 will cause pg2 to remain flat. Maintaining constant Vsg in P0 and P2 enables the current mirrors to accurately/quickly respond to rapid changes in input voltages. In other aspects, the comparator circuit operation is the same as discussed above regarding circuit 100'. By providing these capacitors (which may have a capacitance level of between approximately 0.5 and 5.0 picofarads), the comparator response is desensitized to the slew rate of the inputs, while the positive feedback enables the comparator to respond quickly despite having reduced bias currents.

With the arrangement shown in FIG. 6, the comparison proceeds with minimal bias current. In one example embodiment, high speed operation is realized such that a correct comparison output is generated quickly (e.g., within 100 nanoseconds) with low current consumption, e.g., in a circuit having a static current consumption of, e.g., less than one micro-ampere (and which may be as low as 10 nano-amperes in a given design). Furthermore, this short response time is achieved when one or more input voltages is changing at a high slew rate (e.g., 5 volts per microsecond).

Note that in certain cases the rising transition of v2_high/v1_high is the fastest transition (and both can be high at the same time). In some cases, digital logic can be provided to monitor for low-to-high transition of these signals.

Figure 7:
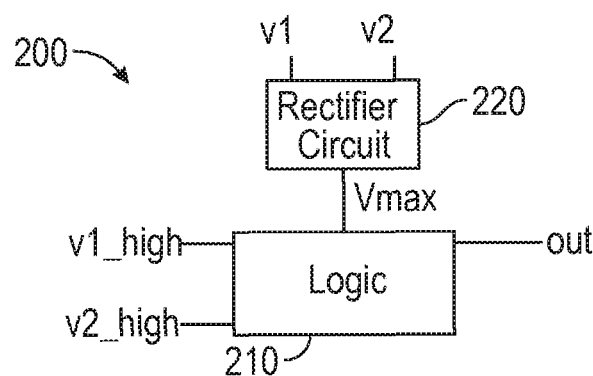
FIG. 7 is a block diagram of a logic circuit in accordance with an embodiment.
Figure 8A:
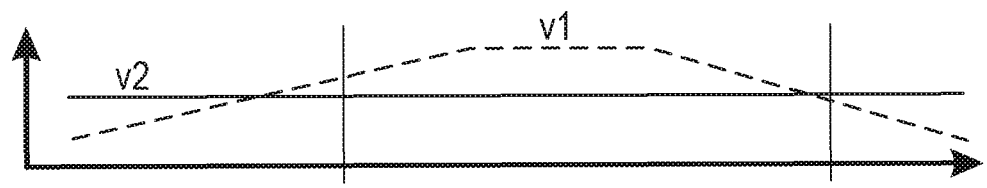
FIGS. 8A-8C are graphical illustrations of signal levels during operation of a comparator circuit in accordance with an embodiment.
Figure 8B:
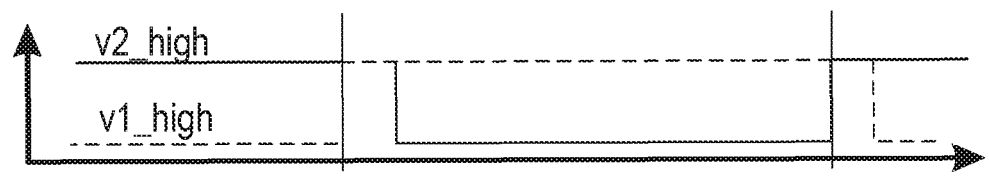
Figure 8C:
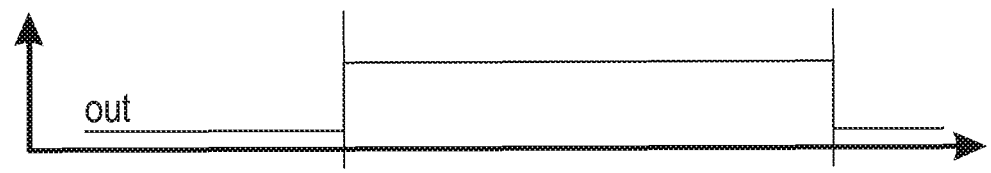

Referring now to FIG. 7, shown is a block diagram of a logic circuit in accordance with an embodiment. As seen in FIG. 7, circuit 200 receives the incoming voltages v2 and v1 and via a rectifier circuit 220 provides the maximum of these two voltages as Vmax to power a digital logic 210. In an embodiment, rectifier circuit 220 may be implemented with cross-coupled PMOS devices, each having a source terminal to receive one of the input voltages, a gate terminal coupled to the other input voltage, and a drain terminal to provide the higher of the two voltages as Vmax. As further illustrated, digital logic 210 is further coupled to receive the comparison output signals of dual comparator paths of a comparator circuit as described herein (v1_high and v2_high). In turn, digital logic 210 outputs a decision signal, out, which is high responsive to a high transition in v1_high and low responsive to a high transition in v2_high. FIGS. 8A-8C show a graphical illustration of the comparison output signals and the logic output signals, responsive to a varying v1 signal.

Figure 9:
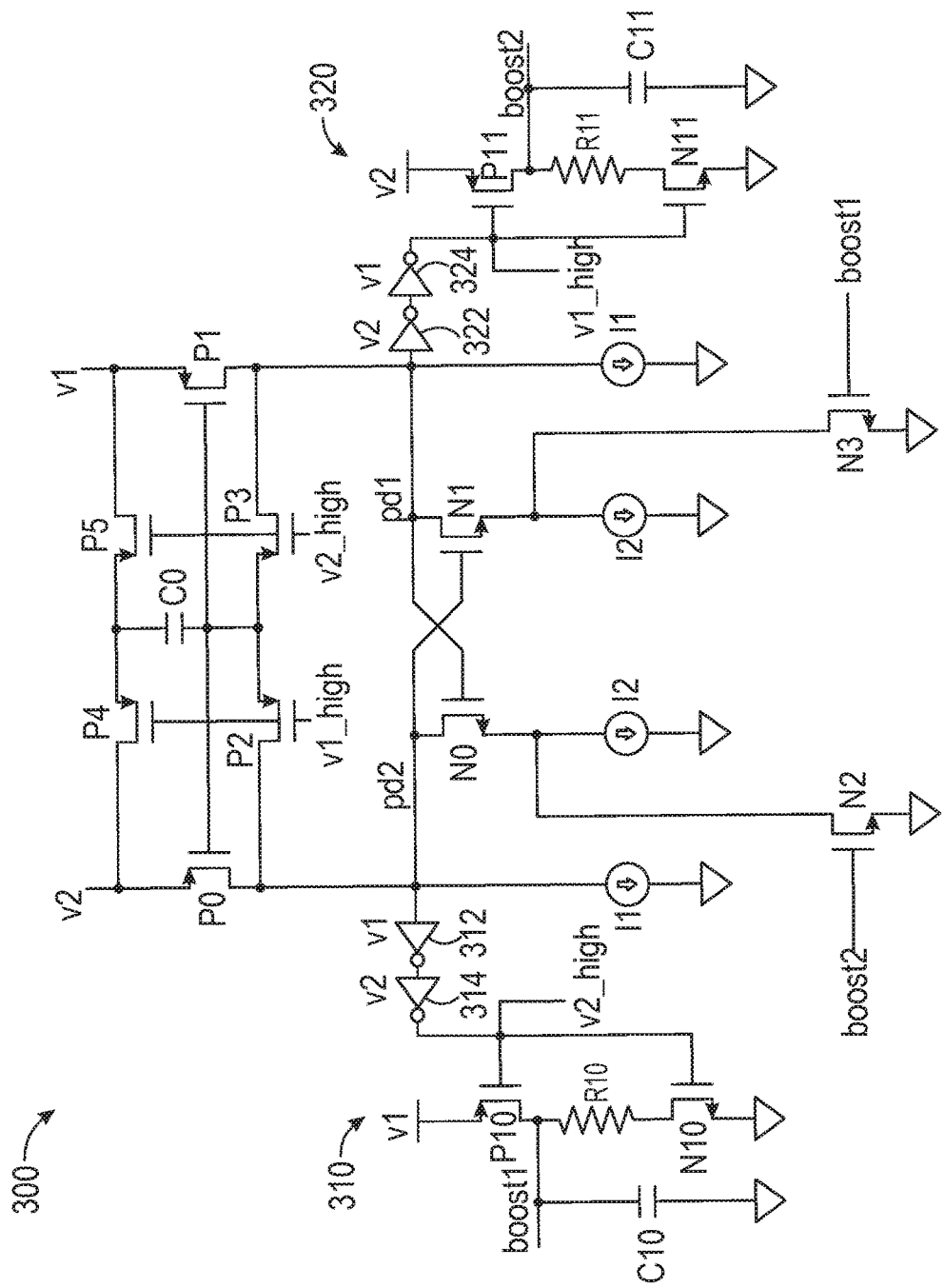
FIG. 9 is a schematic diagram of a comparator circuit in accordance with another embodiment.

In other embodiments, a single comparator-based voltage comparator arrangement can be provided. Referring now to FIG. 9, shown is a schematic diagram of a comparator circuit 300 in accordance with another embodiment. As shown in this arrangement, only a single comparator 300 is present. This single comparator with feedback can be implemented with lower power and smaller area. As seen, PMOSs P4 and P5 have drain terminals coupled to the source terminals of PMOSs P0 and P1. Similarly, PMOSs P2 and P3 have drain terminals coupled to the drain terminals of PMOSs P0 and P1. In operation, only one of PMOSs P4 and P5 is active and only one of PMOSs P2 and P3 is active, such that the input stage in operation is similar to a single one of comparator circuits 110" and 120" of FIG. 6, in that capacitor C0 couples between the source and gate terminals of the one of PMOSs P0 and P1 associated with the active (switched on) PMOSs P4/P5 and P2/P3 to form a current mirror configuration. As such, this single comparator provides a diode connection with the input device (P0 and P1) gates switchable to the device having the higher voltage.

Positive feedback is provided as in the prior circuits using cross-coupled NMOSs N0 and N1 that couple to bias currents I1 and I2, and PMOSs P0 and P1, and provide comparison signals pd1 and pd2, which are output to corresponding inverters 322, 324 and 312, 314, respectively (as in FIG. 2). These inverters provide comparison outputs v1_high and v2_high.

As seen, these comparison outputs are provided to delay circuits 310 and 320, respectively, that in turn output control signals (as boost2 and boost1, respectively) to gate corresponding NMOS devices N2 and N3, which act as boost or pull down currents that decay according to the corresponding RC constants of the delay circuits.

As further illustrated in FIG. 9, with reference to delay circuit 320, drain terminal of PMOS P11 provides control signal boost2. As seen, this signal decays according to a delay constant of RC network formed of capacitor C11 and resistor R11, coupled in series with NMOS N11. In turn, PMOS P11 and NMOS N11 have commonly coupled gate terminals, gated by the comparison output signal v1_high. Similar coupling of components within delay circuit 310 is also shown.

Figure 10:
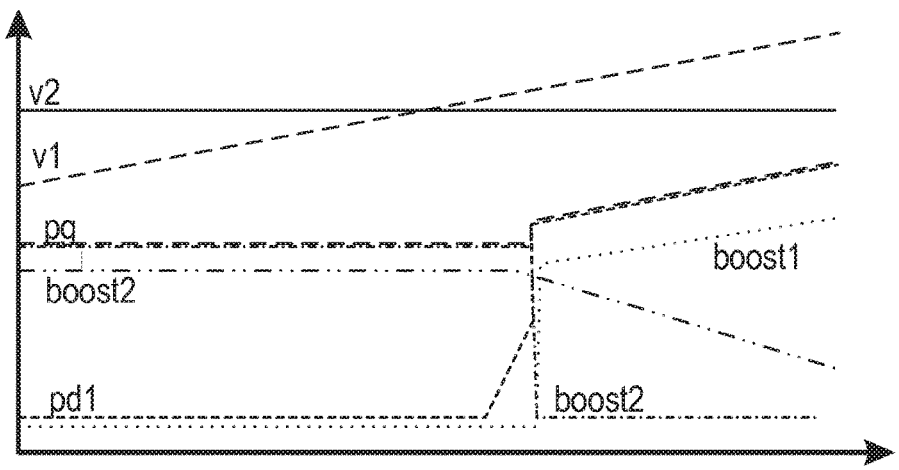
FIG. 10 is a graphical illustration of signal operation in the comparator circuit of FIG. 9.

FIG. 10 shows a graphical illustration of the varying signals within circuit 300 based on a fixed value of v2, and an increasing value of v1. Note that in an embodiment, circuit 300 may be coupled to a logic circuit (such as described above in FIG. 7).

Figure 11:
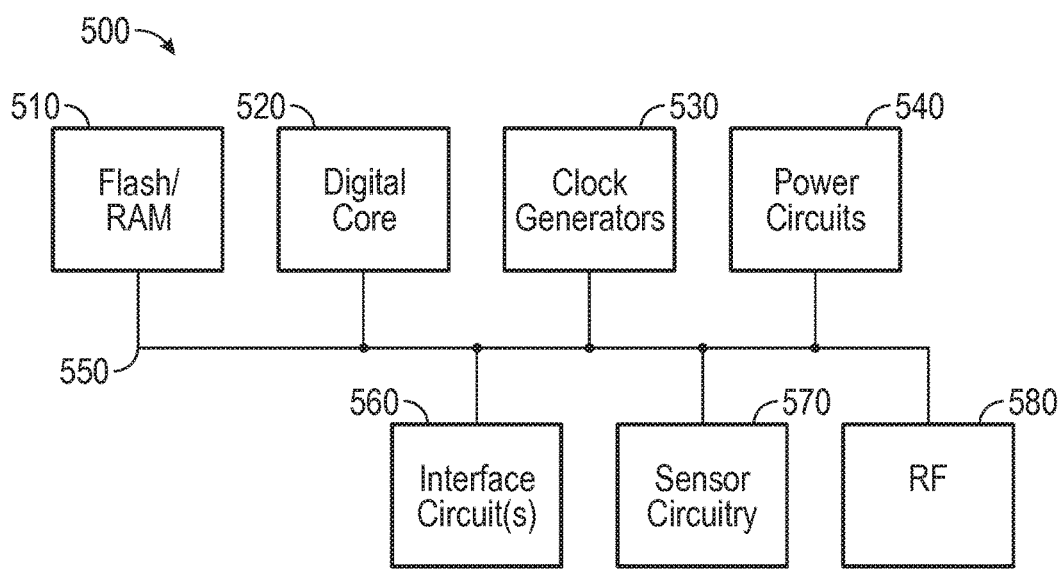
FIG. 11 is a block diagram of a representative integrated circuit in accordance with an embodiment.

Referring now to FIG. 11, shown is a block diagram of a representative integrated circuit 500 which in the embodiment shown is a microcontroller unit (MCU) which may include a high speed low current voltage comparator as described herein. In the embodiment shown in FIG. 11, MCU 500 may be, e.g., a 32-bit MCU that can be used for a variety of use cases, including sensing, monitoring, embedded applications, communications, applications and so forth. In the embodiment shown, MCU 500 includes a memory system 510 which in an embodiment may include a non-volatile memory such as a flash memory and volatile storage, such as RAM. Memory system 510 couples via a bus 550 to a digital core 520, which may include one or more cores and/or microcontrollers that act as a main processing unit of the MCU. In turn, digital core 520 may couple to clock generators 530 which may provide one or more PLLs or other clock generation circuitry to generate various clocks for use by circuitry of the MCU.

As further illustrated, MCU 500 further includes power circuitry 540. Such power circuits may include and one or more voltage regulators as described herein. To this end, such voltage regulators may include or be associated with comparator circuitry as described in FIGS. 1-10, to enable high speed, low power switching of a supply source for a regulator. As further illustrated in FIG. 11, additional circuitry may optionally be present depending on particular MCU implementation to provide various functionality and interaction with external devices. Such circuitry may include interface circuitry 560 which may provide interface with various off-chip devices, sensor circuitry 570 which may include various on-chip sensors including digital and analog sensors to sense desired signals or so forth. In addition as shown in FIG. 11, RF circuitry 580 may be provided which may include analog circuitry of a transceiver to enable transmission and receipt of wireless signals, e.g., according to one or more of a local area or wide area wireless communication scheme, such as Zigbee, Bluetooth, IEEE 802.11, cellular communication or so forth. Understand while shown with this high level view, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a first comparator having a first common gate input stage with a first input terminal to receive a first voltage and a second input terminal to receive a second voltage, a first capacitor coupled between the first input terminal and a common gate connection of the first common gate input stage, the first common gate input stage to output a first comparison signal, and a first feedback circuit to provide a first boost current to the first common gate input stage responsive to a first value of the first comparison signal and to pull down a level of the first comparison signal responsive to a first value of a second comparison output signal, the first comparator to output a first comparison output signal based on the first comparison signal; and
   a second comparator having a second common gate input stage with a first input terminal to receive the second voltage and a second input terminal to receive the first voltage, and a second capacitor coupled between the first input terminal of the second common gate input stage and a common gate connection of the second common gate input stage, the second common gate input stage to output a second comparison signal, the second comparator to output the second comparison output signal based on the second comparison signal.

2. The apparatus of claim 1, further comprising a second feedback circuit to provide a second boost current to the second common gate input stage responsive to a first value of the second comparison signal and to pull down a level of the second comparison signal responsive to a first value of the first comparison output signal.

3. The apparatus of claim 1, wherein the first comparator further comprises:
   a first inverter to receive the first comparison signal and to invert the first comparison signal, the first inverter to be powered by the first voltage; and
   a second inverter to receive the inverted first comparison signal and to output the first comparison output signal, the second inverter to be powered by the second voltage.

4. The apparatus of claim 1, wherein the first comparator further comprises:
   a first delay circuit to receive the first comparison output signal and to output a first control signal to enable the first feedback circuit to provide the first boost current.

5. The apparatus of claim 4, wherein the first delay circuit comprises:
   a first metal oxide semiconductor field effect transistor (MOSFET) having a gate terminal to receive the first comparison output signal and a second terminal coupled to a resistor-capacitor (RC) network; and
   a second MOSFET having a gate terminal to receive the first comparison output signal and a second terminal coupled to the resistor of the RC network, the RC network to provide the first control signal to the first feedback circuit.

6. The apparatus of claim 1, wherein the first comparator is to generate the first comparison output signal within 100 nanoseconds of a change in at least one of the first voltage and the second voltage.

7. The apparatus of claim 1, wherein the first feedback circuit includes a first branch, the first branch to be disabled based on a state of the second comparison output signal, wherein disabling the first branch is to reduce power consumption of the apparatus.

8. The apparatus of claim 7, wherein the first branch comprises:
   a first MOSFET having a gate terminal to receive the second comparison output signal, a first terminal coupled to a first current source and a second MOSFET, and a second terminal coupled to an output of the first common gate input stage.

9. The apparatus of claim 7, wherein the first feedback circuit further includes a second branch comprising a third MOSFET having a gate terminal to receive the first comparison signal, a first terminal coupled to a fourth MOSFET, and a second terminal coupled to the first common gate input stage, wherein the fourth MOSFET is to be gated by a first control signal received from a first delay circuit.

10. The apparatus of claim 1, further comprising:
    a logic circuit to monitor for a transition in at least the first comparison output signal and to generate an output signal based thereon; and
    a rectifier circuit to provide a maximum one of the first voltage and the second voltage to the logic circuit.

11. The apparatus of claim 10, wherein the apparatus comprises an integrated circuit (IC) including a voltage regulator to receive and regulate a selected one of the first voltage and the second voltage, based on the output signal.

12. An apparatus comprising:
a voltage comparator circuit including a first comparator circuit to compare a first voltage and a second voltage and a second comparator circuit to compare the first voltage and the second voltage, the voltage comparator circuit including charge storage circuitry and positive feedback circuitry to boost current within the first and second comparator circuits to enable the voltage comparator circuit to output a comparison decision within a delay threshold in response to input transitions within a slew rate threshold, wherein the first comparator circuit comprises:
a first common gate input stage to receive the first voltage and the second voltage and to generate a first comparison value based on the comparison of the first voltage and the second voltage, wherein the first common gate input stage comprises:
a first metal oxide semiconductor field effect transistor (MOSFET) having a first terminal to couple to the first voltage, a second terminal to couple to a first current source, and a gate terminal coupled to a gate terminal of a second MOSFET, the second terminal of the first MOSFET to further couple to the gate terminal of the first MOSFET; and
the second MOSFET having a first terminal to couple to the second voltage and a second terminal to output the first comparison value; and
a first feedback circuit to control a level of the first comparison value, wherein the first comparator circuit is to output a first comparison output signal based on the first comparison value; and
wherein the second comparator circuit comprises:
a second common gate input stage to receive the first voltage and the second voltage and to generate a second comparison value based on the comparison of the first voltage and the second voltage; and
a second feedback circuit to control a level of the second comparison value, wherein the second comparator circuit is to output a second comparison output signal based on the second comparison value, wherein the first comparison output signal and the second comparison output signal comprise the comparison decision.

13. The apparatus of claim 12, wherein the first feedback circuit comprises a third MOSFET having a first terminal to couple to a second current source, a second terminal coupled to the second terminal of the second MOSFET, and a gate terminal to receive the second comparison output signal.

14. The apparatus of claim 12, further comprising a first capacitor coupled to the gate terminal and the first terminal of the first MOSFET.

15. The apparatus of claim 12, further comprising a logic circuit to receive the first comparison output signal and the second comparison output signal and to output an output signal based thereon.

16. An apparatus comprising:
a voltage regulator to receive a first voltage from a first voltage source, a second voltage from a second voltage source, a comparator to compare the first voltage and the second voltage, the comparator comprising:
a first comparator having a first common gate input stage with a first input terminal to receive a first voltage and a second input terminal to receive a second voltage, a first capacitor coupled between the first input terminal and a common gate connection of the first common gate input stage, the first common gate input stage to output a first comparison signal, and a first feedback circuit to provide a first boost current to the first common gate input stage responsive to a first value of the first comparison signal and to pull down a level of the first comparison signal responsive to a first value of a second comparison output signal, the first comparator to output a first comparison output signal based on the first comparison signal; and
a second comparator having a second common gate input stage with a first input terminal to receive the second voltage and a second input terminal to receive the first voltage, and a second capacitor coupled between the first input terminal of the second common gate input stage and a common gate connection of the second common gate input stage, the second common gate input stage to output a second comparison signal, the second comparator to output the second comparison output signal based on the second comparison signal, wherein the voltage regulator is to output a regulated voltage based at least in part on the comparison of the first voltage and the second voltage.

17. The apparatus of claim 16, further comprising:
a logic circuit to monitor for a transition in at least the first comparison output signal and to generate an output signal based thereon; and
a rectifier circuit to provide a maximum one of the first voltage and the second voltage to the logic circuit.

18. The apparatus of claim 17, wherein the apparatus comprises an integrated circuit (IC) including a voltage regulator to receive and regulate a selected one of the first voltage and the second voltage, based on the output signal.

* * * * *